United States Patent
Krishna et al.

(10) Patent No.: US 11,508,869 B2
(45) Date of Patent: Nov. 22, 2022

(54) LATERAL INTERBAND TYPE II ENGINEERED (LITE) DETECTOR

(71) Applicant: Ohio State Innovation Foundation, Columbus, OH (US)

(72) Inventors: Sanjay Krishna, Plain City, OH (US); Sri Harsha Kodati, Columbus, OH (US); Theodore Ronningen, Lewis Center, OH (US); Seunghyun Lee, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 51 days.

(21) Appl. No.: 16/986,758

(22) Filed: Aug. 6, 2020

(65) Prior Publication Data
US 2021/0043791 A1  Feb. 11, 2021

Related U.S. Application Data

(60) Provisional application No. 62/883,236, filed on Aug. 6, 2019.

(51) Int. Cl.
*H01L 31/102* (2006.01)
*H01L 31/109* (2006.01)
*H01L 31/11* (2006.01)

(52) U.S. Cl.
CPC ........ *H01L 31/109* (2013.01); *H01L 31/1105* (2013.01)

(58) Field of Classification Search
CPC ......... H01L 31/11–1105; H01L 31/109; H01L 31/1013; H01L 31/105; H01L 31/107
See application file for complete search history.

(56) References Cited

U.S. PATENT DOCUMENTS 4,142,200 A * 2/1979 Mizushima ........... H01L 31/107
257/438
4,454,526 A * 6/1984 Nishizawa ........ H01L 27/14679
257/292

(Continued)

OTHER PUBLICATIONS

Cai, W. Z., and D. L. Miller. "Band offsets of AlxGa 1—x SbAs/InGaAs heterojunctions." Journal of Vacuum Science & Technology B: Microelectronics and Nanometer Structures Processing, Measurement, and Phenomena 20.2 (2002): 512-522.

(Continued)

*Primary Examiner* — Calvin Y Choi
(74) *Attorney, Agent, or Firm* — Meunier Carlin & Curfman LLC

(57) ABSTRACT

A lateral interband Type II engineered (LITE) detector is provided. LITE detectors use engineered heterostructures to spatially separate electrons and holes into separate layers. The device may have two configurations, a positive intrinsic (PIN) configuration and a BJT (Bipolar junction transistor) configuration. The PIN configuration may have a wide bandgap (WBG) layer that transports the holes above a narrow bandgap (NBG) absorber layer that absorbs the target radiation and transports the electrons. The BJT configuration may have a WBG layer operating as a BJT above an NBG layer. In both configurations, the LITE design uses a Type II staggered offset between the NBG layers and the WBG layers that provides a built-in field for the holes to drift from an absorber region to a transporter region.

34 Claims, 2 Drawing Sheets

(56) References Cited

U.S. PATENT DOCUMENTS

| | | | |
|---|---|---|---|
| 4,476,477 A | | 10/1984 | Capasso et al. |
| 4,486,765 A | | 12/1984 | Capasso |
| 4,553,317 A | | 11/1985 | Sakaki et al. |
| 4,599,632 A | | 7/1986 | Bethea et al. |
| 5,754,714 A | * | 5/1998 | Suzuki .................. H01S 5/0601 385/5 |
| 10,176,991 B1 | * | 1/2019 | Lagally .................. C30B 29/68 |
| 2008/0173874 A1 | * | 7/2008 | Wang .................. H01L 29/7371 257/76 |
| 2010/0140755 A1 | * | 6/2010 | Atanackovic .......... G02B 6/125 257/632 |
| 2017/0264079 A1 | * | 9/2017 | Oh ......................... H01S 5/142 |
| 2020/0203548 A1 | | 6/2020 | Zeng et al. |

OTHER PUBLICATIONS

Capasso, "The channeling avalanche photodiode: A novel ultra-low-noise interdigitated p-n junction detector," IEEE Transactions on Electron Devices, vol. 29, No. 9, pp. 1388-1395, 1982, doi: 10.1109/T-ED.1982.20887.

Capasso, Federico. "Band-gap engineering via graded gap, superlattice, and periodic doping structures: Applications to novel photodetectors and other devices." Journal of Vacuum Science & Technology B: Microelectronics Processing and Phenomena 1.2 (1983): 457-461.

Capasso, R. A. Logan, W. T. Tsang, and J. R. Hayes, "Channeling photodiode: A new versatile interdigitated p-n junction photodetector," Appl. Phys. Lett., vol. 41, No. 10, pp. 944-946, 1982, doi: 10.1063/1.93344.

Goh, Yu Ling, et al. "Excess noise measurement in In0.53Ga0.47As." IEEE photonics technology letters 17.11 (2005): 2412-2414.

Lee, S., A. Kazemi, S. H. Kodati, S. Mathews, T. Ronningen, M. Winslow, C. H. Grein, N. Ye, A. H. Jones and J. C. Campbell (2018). InAs/AlSb type II superlattice avalanche photodiodes. Proc. SPIE 10637, Laser Technology for Defense and Security XIV, 106370Q.

Li, K. F., et al. "Low avalanche noise characteristics in thin InP p/sup+/-in/sup+/diodes with electron initiated multiplication." IEEE Photonics Technology Letters 11.3 (1999): 364-366.

Madison Elizabeth Woodson, "LowNoise AlInAsSb Avalanche Photodiodes" PhD diss., University of Virginia, 2017.

Rees, G. J., and J. P. R. David. "Nonlocal impact ionization and avalanche multiplication." Journal of Physics D: Applied Physics 43.24 (2010): 243001.

Ren, Min, et al. "AlInAsSb separate absorption, charge, and multiplication avalanche photodiodes." Applied Physics Letters 108.19 (2016): 191108.

Ren, Min, et al. "AlInAsSb/GaSb staircase avalanche photodiode." Applied Physics Letters 108.8 (2016): 081101.

Tanoue and Sakaki, "A new method to control impact ionization rate ratio by spatial separation of avalanching carriers in multilayered heterostructures," Appl. Phys. Lett., vol. 41, No. 1, pp. 67-70, 1982, doi: 10.1063/1.93331.

Yuan, P., et al. "Impact ionization characteristics of III-V semiconductors for a wide Yange of multiplication region thicknesses." IEEE journal of quantum electronics 36.2 (2000): 198-204.

Zeng, Z. Huang, B. Wang, D. Liang, M. Fiorentino, and R. G. Beausoleil, "Silicon-germanium avalanche photodiodes with direct control of electric field in charge multiplication region," Optica, vol. 6, No. 6, 2019, doi:10.1364/optica.6.000772.

* cited by examiner

LATERAL INTERBAND TYPE II ENGINEERED (LITE) DETECTOR

CROSS-REFERENCE TO RELATED APPLICATIONS

This application claims the benefit of U.S. provisional patent application No. 62/883,236, filed on Aug. 6, 2019, and entitled "LATERAL INTERBAND TYPE II ENGINEERED (LITE) DETECTOR," the disclosure of which is expressly incorporated herein by reference in its entirety.

STATEMENT REGARDING GOVERNMENT SUPPORT

This invention was made with government support under grant number N00014-17-1-2440 awarded by the United States Office of Naval Research. The government has certain rights in the invention.

BACKGROUND

Avalanche photodiodes (APDs) that target a wavelength of 1550 nm have several applications ranging from optical communications to imaging to single photon detection. There is increasing interest in APDs for longer wavelengths. A distinctive feature of an APD is high sensitivity due to the gain achieved by the impact ionization of carriers. Because impact ionization is a stochastic process, it introduces excess noise that limits the signal to noise ratio of an APD.

APDs compared to conventional photodetectors have the advantage of higher sensitivity because of the gain that emanates from the impact ionization of carriers. However, this comes at a cost of higher excess noise that fundamentally arises from the stochastic nature of the impact ionization It is with respect to these and other considerations that the various aspects and embodiments of the present disclosure are presented.

SUMMARY

A lateral interband Type II engineered (LITE) detector is provided. LITE detectors use engineered heterostructures to spatially separate electrons and holes into separate layers. The device may have two configurations, a positive intrinsic (PIN) configuration and a BJT (Bipolar junction transistor) configuration. The PIN configuration may have a wide bandgap (WBG) layer that transports the holes above or below a narrow bandgap (NBG) absorber layer that absorbs the target radiation and transports the electrons. The BJT configuration may have a WBG layer operating as a BJT above or below a NBG layer. In both configurations, the LITE design uses a Type II staggered offset between the NBG layers and the WBG layers that provides a built-in field for the holes to drift from an absorber region to a transporter region. In addition to the built-in field caused by the heterojunction line up and doping profile, there is an additional applied field typically in the lateral direction. The local field at any point is the vector sum of this field.

Because the holes are transported in a different material, there are different gains that can be achieved. At low bias values, photoconductive gain is obtained which is related to the ratio of the recombination time of the slow carrier to the transit time of the fast carrier. At higher bias values, the carriers can impact ionize. However, because the holes are in a wider band gap region, the probability of impact ionization of the hole is small. This could lead to a low excess noise to due to the small value of k (ratio of the impact ionization coefficients). If the transporter layer is a BJT, the carriers are injected into the base of the transistor and the carriers are multiplied due to the transistor gain.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
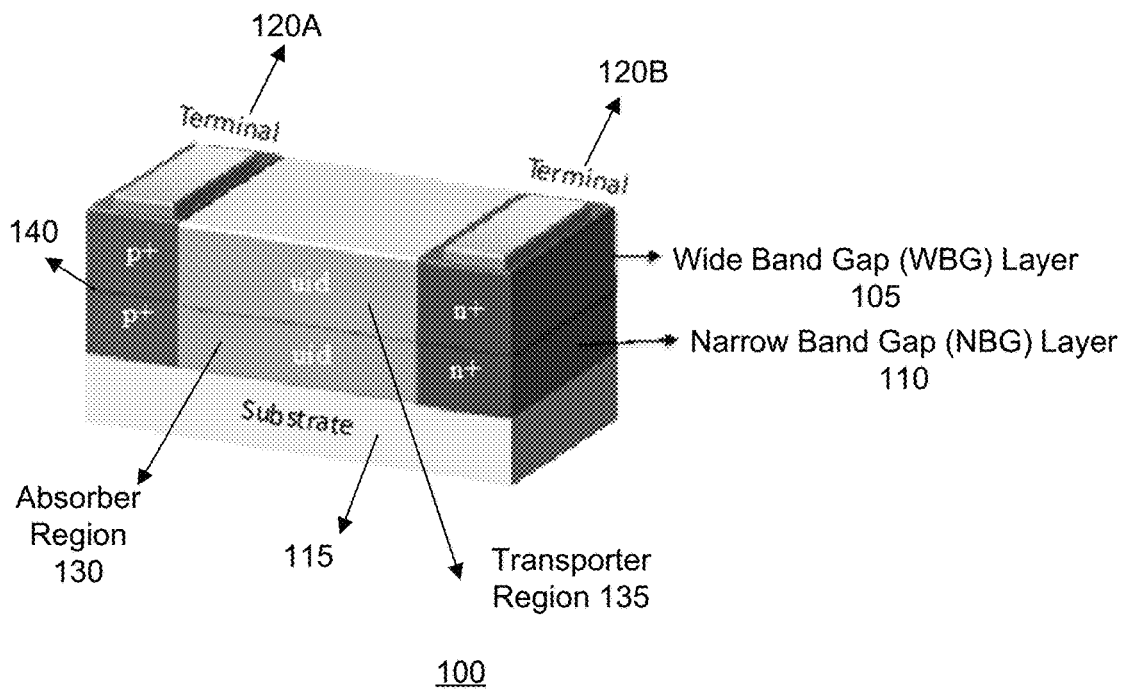
FIG. 1 is an illustration of an exemplary semiconductor device.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

FIG. 1 is an illustration of an exemplary semiconductor device 100. Depending on the embodiment, the semiconductor device may be a photodetector and more specifically a lateral interband Type II engineered (LITE) detector.

In the example shown, the device 100 includes a terminal 120A, and a terminal 120B, and a substrate 115. The terminal 120A may be a negative terminal to p+ and the terminal 120B may be a positive terminal to n+, and together they may control and monitor the voltage or current applied to the device 100. In particular, a bias voltage may be applied so that the electrons are driven towards the anode. The substrate 115 may be made from a variety of semiconductors including group IV semiconductors such as Si, Ge, or III-V semiconductors such as GaAs, InP, GaSb, InAs, InSb, GaN, InN, AlN, or group II-VI semiconductors such as CdTe, ZnTe, HgTe, and their alloys. Other materials may be used.

The device 100 may further include a wide band gap layer (WBG) 105 and a narrow band gap (NBG) layer 110 located on top of the substrate 115. The NBG layer 110 may have an absorber region 130 whose bandgap is optimized to absorb incident radiation. The WBG layer 105 may have a transport region 135 whose bandgap is optimized to transport carriers (e.g., electrons or holes). In some embodiments, the NBG layer 110 and the WBG layer 105 may be approximately the same size. Alternatively, the NBG layer 110 may be thinner than the WBG layer 105. The thicknesses, doping level and the composition of the NBG and WBG may be chosen carefully with various design constraints. They include, but are not limited to, charge neutrality, carrier confinement, limiting field to be below tunneling threshold and suppressing hole impact ionization. Typical numbers for the thickness and doping of the WBG and NBG layer may range from 10 nm-10 microns and 1e14-1e19 $cm^{-3}$ respectively.

The NBG layer 110 and the WBG layer 105 may spatially separate electrons or holes using a built-in field to preferentially inject a carrier from the WBG layer 105 to the NBG 110 layer. In one embodiment, the WBG layer 105 and the NBG layer 110 may have a Type II staggered line up, or band line up, that causes the built-in field. However, Type I and Type III band line ups may also be used.

The WBG layer 105 and the NBG layer 110 may be semiconductors. Suitable semiconductors include one or more of binary, ternary, quaternary, or superlattice III-V, group IV, or II-VI semiconductors. Other types of semiconductors may be used.

Examples of suitable materials for the WBG layer 105 include the bulk semiconductor $Al_{0.1}Ga_{0.9}As_{0.52}Sb_{0.48}$. Examples of suitable materials for the NBG layer 110 include the bulk semiconductor $In_{0.53}Ga_{0.47}As$. Other materials with different band alignments may be used.

The WBG layer 105 may be selected to absorb optical photons at a shorter wavelength than the NBG layer 110. The WBG layer 105 may be placed above the NBG layer 110 so that long wavelength light passes through it and is then absorbed in the NBG layer 110.

The NBG layer 110 (and applied voltage) may be selected to promote avalanche multiplication. The WBG layer 105 may be designed to suppress hole multiplication.

In some embodiments, the device 100 may include a plurality of WBG layers 105 and NBG layers 110. The layers may be alternating such that every WBG layer 105 is followed by an NBG layer 110. Furthermore, there may be a spacer layer 140 between each WBG layer 105 and NBG layer 110. The spacer layer 140 can range from 1 nanometer-1 micrometer.

The NBG layer 110 and the WBG layer 105 may each have variables such as layer composition, thickness, lateral dimensions, and background doping that can be selected for various purposes. These purposes may include photocurrent generation and photovoltaic generation. Depending on the embodiment, the variables may be selected to maximize a signal-to-noise ratio while avoiding internal gain. Alternatively, the variables may be selected to maximize a signal-to-noise ratio without avoiding internal gain. The composition for the ternary or the quaternary layers could be from 0-1 mole fraction for each of the sub-lattice constituents. The thickness may vary from 10 nm-10 microns. The lateral dimensions may vary from 100 nm-1000 microns. The background doping may vary from 1e13-1e17 $cm^{-3}$.

In some embodiments, the WBG layer 105 may be made from an indirect material so that photon absorption takes place only in the NBG layer 110. A suitable indirect material is AlGaSb, AlAsSb, InAlSb, InAlAs, AlGaAsSb or AllnAsSb. In other embodiments, the WBG layer 105 may be made from a direct material so that photon absorption takes place both in the WBG layer 105 and the NBG layer 110. A suitable direct material is InAs, GaSb, InP, GaAs, InGaAs, InGaAlAs, or InAsSb.

In some embodiments, the variables of the NBG layer 110 and the WBG layer 105 (e.g., layer composition, layer thickness, and background doping) may be selected to optically confine one or more photons in the NBG layer 110. Example variable values to confine one or more photons include 0-1 mole fraction of the sub-lattice constituents for the ternary or the quaternary layers. The thickness would vary from 10 nm-10 microns. The lateral dimensions could vary from 100 nm-1000 microns. The background doping could vary from 1e13-1e17 $cm^{-3}$.

The device 100 of FIG. 1 may be an example of what is referred to herein as a positive intrinsic (PIN) configuration. As shown, in the PIN configuration, the device 100 may include, in the transporter region 135, n+ doping characteristics below the terminal 120A, an undoped region between the terminals 120A and 120B, and p+ doping characteristics below the terminal 120B. The device 100 may further include, in the absorber region 130, n+ doping characteristics below the terminal 120A, an undoped region between the terminals 120A and 120B, and p+ doping characteristics below the terminal 120B.

The device 100 may operate in the following way. A low energy (i.e., long wavelength) photon may be absorbed in the absorber region 130, of the NBG layer 110 and as a result may generate an electron-hole pair. Because of the applied voltage bias to the terminals 120A and 120B, the electron from the electron-hole pair may be driven towards the n+ doped region of the NBG layer 110 and the terminal 120B. Also because of the applied voltage bias, the hole from the pair may be driven towards the p+ doped region of the NBG layer 110 and the terminal 120A. Because of the Type II band alignment between the NBG layer 110 and the WBG layer 105, electrons are kept in the absorber region 130 and holes are drawn into the transporter region 135. This creates a special separation between the electrons and the holes as they cross a lateral region of the NBG layer 110.

Figure 2:
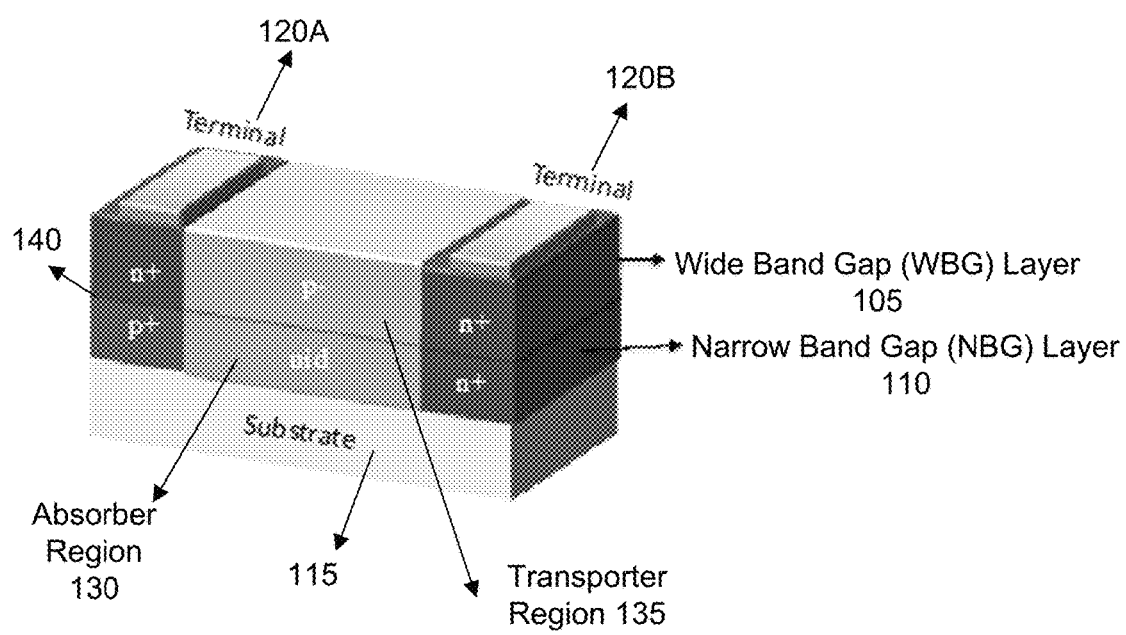
FIG. 2 is an illustration of another exemplary semiconductor device.

FIG. 2 is an illustration of a device 200. Similar to the device 100, the device 200 may include several components including a terminal 120A, a terminal 120B, one or more WBG layers 105, one or more NBG layers 110, a spacer layer 140, and a substrate 115. The WBG layer 105 may include a transporter region 135 and the NBG layer 110 may include an absorber region 130. The device 200 may be an example of what is referred to herein as a bipolar junction transistor (BJT) configuration. Note that some or all of the various features, variables, and configurations described above with respect to the device 100 may also apply to the device 200.

As shown, in the BJT configuration, the device 200 may include, in the transporter region 135, n+ doping characteristics below the terminal 120A, p+ doping characteristics in the region between the terminal 120A and the terminal 120B, and n+ doping characteristics below the terminal 120B. The device 200 may further include, in the absorber region 130, n+ doping characteristics below the terminal 120B, an undoped region between the terminal 120A and the terminal 120B, and p+ doping characteristics below the terminal 120A.

The device 200 may operate in the following way. A low energy (i.e., long wavelength) photon may be absorbed in the absorber region 130, of the NBG layer 110 and as a result may generate an electron-hole pair. Because of the applied voltage bias to the terminals 120A and 120B, the electron from the electron-hole pair may be driven towards the n+ doped region of the NBG layer 110 and the terminal 120B. Also because of the applied voltage bias, the hole from the pair may be driven towards the n+ doped region of the NBG layer 110 and the terminal 120A. Because of the Type II band alignment between the NBG layer 110 and the WBG layer 105, electrons are kept in the absorber region 130 and holes are drawn into the transporter region 135. This creates a special separation between the electrons and the holes as they cross a lateral region of the NBG layer 110.

Figure 3:
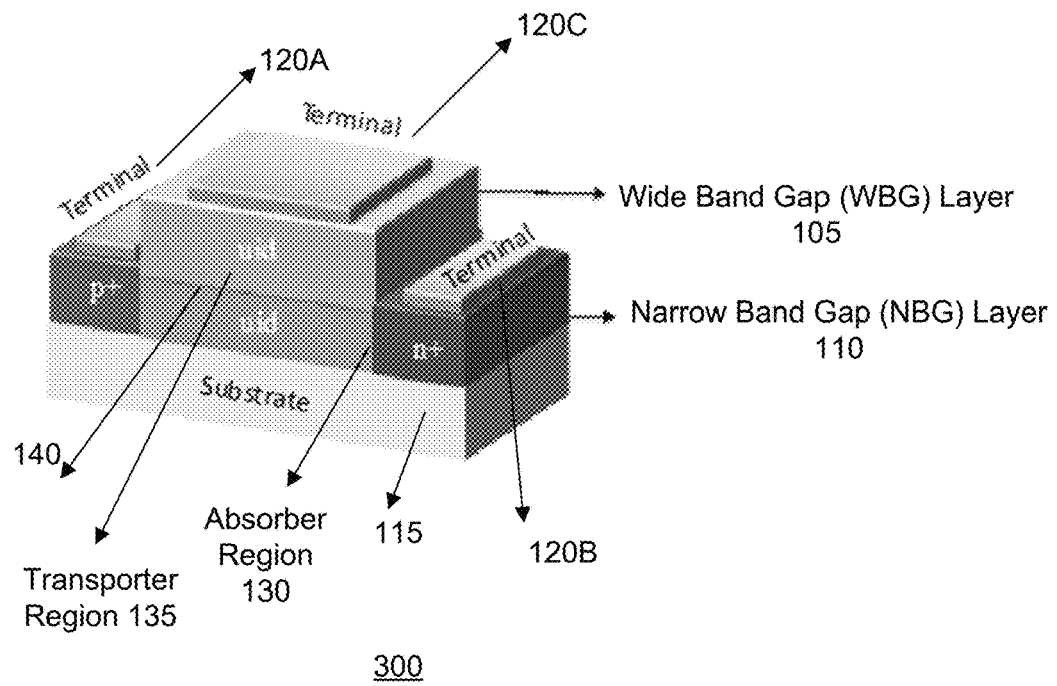
FIG. 3 is an illustration of another exemplary semiconductor device.

FIG. 3 is an illustration of a device 300. The device 300 may be a variation of the device 100 (i.e., the PIN configuration) but with the addition of third terminal 120C. Like the device 100, the device 300 may include several components including a terminal 120A, a terminal 120B, one or more WBG layers 105, one or more NBG layers 110, a spacer layer 140, and a substrate 115. The WBG layer 105 may include a transporter region 135 and the NBG layer 110 may include an absorber region 130. The terminal 120C may be an independent terminal that connects to the WBG layer 105.

Unlike the device 100, the transporter region 135 of the WBG layer 105 does not include any doping characteristics and is not connected to either of the terminals 120A and 120B. Furthermore, the WBG layer 105 is smaller than the NBG layer 110. The NBG layer 110 (including the absorber region 130) may be substantially the same as the NBG layer 110 of the device 100 including doping characteristics. The independent terminal 120C may generate a field that reduces the spatial separation of carriers.

Figure 4:
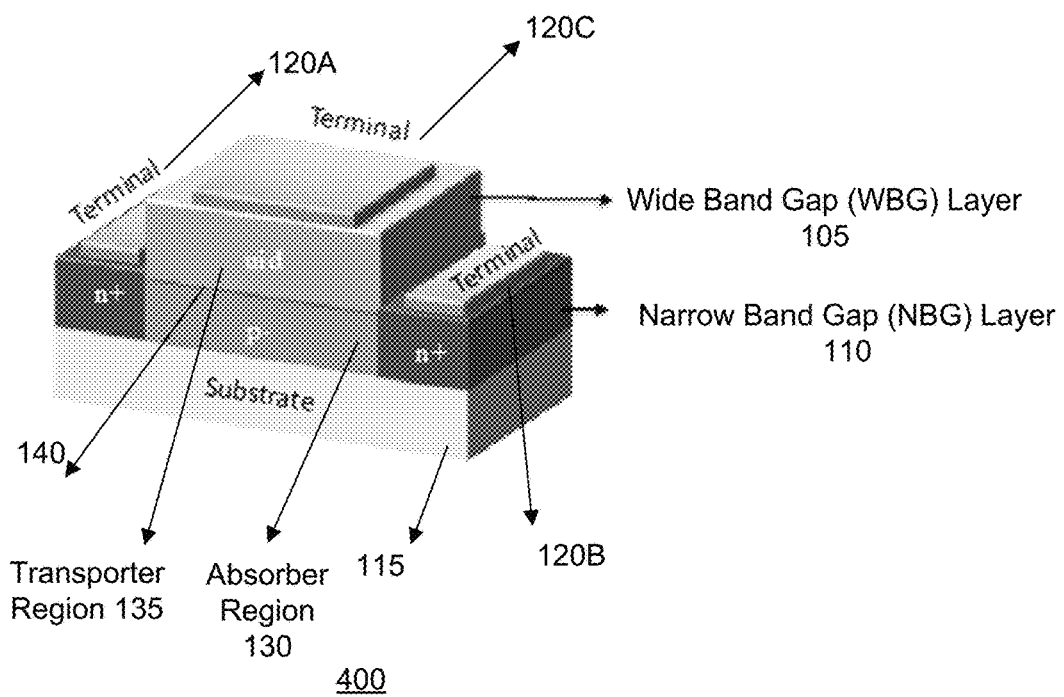
FIG. 4 is an illustration of another exemplary semiconductor device.

FIG. 4 is an illustration of a device 400. The device 400 may be a variation of the device 200 (i.e., the BJT configuration) but with the addition of third terminal 120C. Like the device 200, the device 400 may include several components including a terminal 120A, a terminal 120B, one or more WBG layers 105, one or more NBG layers 110, a spacer layer 140, and a substrate 115. The WBG layer 105 may include a transporter region 135 and the NBG layer 110 may include an absorber region 130. The terminal 120C may be an independent terminal that connects to the WBG layer 105.

Unlike the device 200, the transporter region 135 of the WBG layer 105 does not include any doping characteristics and is not connected to either of the terminals 120A and 120B. Furthermore, the WBG layer 105 is smaller than the NBG layer 110. The NBG layer 110 (including the absorber region 130) may be substantially the same as the NBG layer 110 of the device 200 including doping characteristics. The independent terminal 120C may generate a field that reduces the spatial separation of carriers.

The devices (i.e., the devices 100, 200, 300, and 400) may provide many of the following advantages over prior art devices. The devices may provide for photoconductive gain at a low bias. The devices may provide avalanche gain with reduced excess noise at high bias. The devices may provide improved emitter injection gain due to hole channels. The devices may provide a reduction in break down voltage due to avalanche gain and emitter injection gain. The devices may allow for simplified gate biasing especially in embodiments using the terminal 120C (i.e., the devices 300 and 400).

The devices may provide buried junctions with no surface to passivate. The surfaces of mesa-style detectors can be a dominant source of dark current noise. Surfaces are abrupt interfaces, and the atoms at the surface may have "dangling" bonds that must be be satisfied by bonding to other chemicals. The dangling bonds can support unwanted dark conduction. The described PIN configuration only has junctions within the bulk detector. The avoids the problem of surface conduction and avoids the need for a passivation step.

The devices may further provide the advantage of simplified processing. The fabrication of the semiconductor wafer into detectors and arrays of detectors may be simpler for the devices than for vertical mesas.

The devices may further provide the advantage of large fill factor. In a conventional mesa, portions of the absorber are masked by a metal contact. In a detector using the proposed devices, the entire absorber region 130 (e.g., between the n+ and p+ doped regions) may be exposed to photons.

The devices may further provide the advantage of optical confinement. The variation in the bandgap of the device may lead to a difference of refractive index of a material. This difference may be used to confine light in thin regions to enhance the signal. This may be used for use in resonant enhanced cavities As used herein, the singular form "a," "an," and "the" include plural references unless the context clearly dictates otherwise.

As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed It should be understood that the various techniques described herein may be implemented in connection with hardware components or software components or, where appropriate, with a combination of both. Illustrative types of hardware components that can be used include Field-Programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be affected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A lateral interband semiconductor device comprising:
   a substrate comprising InAs or InP defining a bottom surface of the lateral interband semiconductor device;
   a narrow bandgap semiconductor (NBG) layer disposed on the substrate, the NBG layer comprising a first binary semiconductor material, a first ternary semiconductor material, or a first quaternary semiconductor material;
   a wide bandgap semiconductor (WBG) layer disposed on the NBG layer, the WBG layer comprising a second binary semiconductor material, a second ternary semiconductor material, or a second quaternary semiconductor material, wherein the NBG layer and the WBG layer define a staggered offset therebetween that spatially separate electrons or holes using a built-in field;
   a positive terminal defining a first upper side surface of the lateral interband semiconductor device; and
   a negative terminal opposite the positive terminal, the negative terminal defining a second upper side surface of the lateral interband semiconductor device.

2. The device of claim 1, wherein the WBG layer and the NBG layer comprise one or more of superlattice III-V semiconductors, group IV semiconductors, or group II-VI semiconductors.

3. The device of claim 1, wherein the built-in field is caused by one or more of a Type I, Type II, or Type III band lineup between the WBG layer and the NBG layer.

4. The device of claim 1, wherein the built-in field is caused by controlling a type and an amount of doping in the WBG layer and the NBG layer.

5. The device of claim 1, further comprising a spacer layer between the WBG layer and the NBG layer.

6. The device of claim 1, further comprising a plurality of additional alternating WBG layers and NBG layers.

7. The device of claim 1, wherein the device is a photodetector.

8. The device of claim 1, wherein the NBG layer and the WBG layer have a composition, a thickness, a lateral dimension, and a doping that is selected to maximize a signal-to-noise ratio without internal gain during photocurrent generation.

9. The device of claim 1, wherein the NBG layer and the WBG layer have a composition, a thickness, a lateral dimension, and a doping that is selected to maximize a signal-to-noise ratio with internal gain during photocurrent generation.

10. The device of claim 1, wherein the NBG layer and the WBG layer have a composition, a thickness, a lateral dimension, and a doping that is selected to include bipolar junction transistor (BJT) internal gain during photocurrent generation.

11. The device of claim 1, wherein the WBG layer is made of an indirect material so that photon absorption takes place only in the NBG layer.

12. The device of claim 1, wherein the WBG layer is made of a direct material so that photon absorption takes place both in the WBG layer and the NBG layer.

13. The device of claim 1, further comprising a mask that limits where photon absorption occurs on the device.

14. The device of claim 1, wherein the WBG and NBG layers have a layer composition, a layer thickness, and a background doping selected to optically confine one or more photons in the NBG layer.

15. The device of claim 1, wherein the NBG layer is thinner than the WBG layer.

16. The device of claim 1, further comprising an additional WBG layer between the NBG layer and the substrate.

17. A lateral interband semiconductor device comprising:
   a substrate comprising InAs or InP defining a bottom surface of the lateral interband semiconductor device;
   a narrow bandgap semiconductor (NBG) layer disposed on the substrate, the NBG layer comprising a first binary semiconductor material, a first ternary semiconductor material, or a first quaternary semiconductor material;
   a wide bandgap semiconductor (WBG) layer disposed on the NBG layer, the WBG layer comprising a second binary semiconductor material, a second ternary semiconductor material, or a second quaternary semiconductor material, wherein the NBG layer, the WBG layer, define a staggered offset therebetween that spatially separate electrons or holes using a built-in and applied field;
   a positive terminal defining a first upper side surface of the lateral interband semiconductor device; and
   a negative terminal opposite the positive terminal, the negative terminal defining a second upper side surface of the lateral interband semiconductor device; and
   an independent terminal connected to the WBG layer that is configured to generate a field that reduces spatial separation of the electrons or holes.

18. The device of claim 17, wherein the built-in field is caused by one or more of a Type I, Type II, or Type III band lineup between the WBG layer and the NBG layer.

19. The device of claim 17, wherein the WBG layer and the NBG layer comprise one or more of superlattice III-V semiconductors, group IV semiconductors, or group II-VI semiconductors.

20. The device of claim 17, wherein the built-in field is caused by controlling a type and an amount of doping in the WBG layer and the NBG layer.

21. The device of claim 17, further comprising a spacer layer between the WBG layer and the NBG layer.

22. The device of claim 17, further comprising a plurality of additional alternating WBG layers and NBG layers.

23. The device of claim 17, further comprising a positive terminal and a negative terminal.

24. The device of claim 17, wherein the device is a photodetector.

25. The device of claim 17, wherein the NBG layer and the WBG layer have a composition, a thickness, a lateral dimension, and a doping that is selected to maximize a signal-to-noise ratio without internal gain during photocurrent generation.

26. The device of claim 17, wherein the NBG layer and the WBG layer have a composition, a thickness, a lateral dimension, and a doping that is selected to maximize a signal-to-noise ratio with internal gain during photocurrent generation.

27. The device of claim 17, wherein the NBG layer and the WBG layer have a composition, a thickness, a lateral dimension, and a doping that is selected for photovoltaic generation.

28. The device of claim 17, wherein the NBG layer and the WBG layer have a composition, a thickness, a lateral dimension, and a doping that is selected to include bipolar junction transistor (BJT) internal gain during photocurrent generation.

29. The device of claim 17, wherein the WBG layer is made of an indirect material so that photon absorption takes place only in the NBG layer.

30. The device of claim 17, wherein the WBG layer is made of a direct material so that photon absorption takes place both in the WBG layer and the NBG layer.

31. The device of claim 17, further comprising a mask that limits where photon absorption occurs on the device.

32. The device of claim 17, wherein the WBG and NBG layers have a layer composition, a layer thickness, and a background doping selected to optically confine one or more photons in the NBG layer.

33. The device of claim 17, wherein the NBG layer is thinner than the WBG layer.

34. The device of claim 17, further comprising an additional WBG layer between the NBG layer and the substrate.

* * * * *